(12) United States Patent
Polcik et al.

(10) Patent No.: US 10,781,102 B2
(45) Date of Patent: Sep. 22, 2020

(54) COATING SOURCE FOR PRODUCING DOPED CARBON LAYERS

(71) Applicant: PLANSEE COMPOSITE MATERIALS GMBH, Lechbruck am See (DE)

(72) Inventors: Peter Polcik, Reutte (AT); Sabine Woerle, Pflach (AT); Ulrich Miller, Schongau (DE)

(73) Assignee: Plansee Composite Materials GmbH, Lechbruck am See (DE)

( * ) Notice: Subject to any disclaimer, the term of this patent is extended or adjusted under 35 U.S.C. 154(b) by 140 days.

(21) Appl. No.: 15/556,379

(22) PCT Filed: Mar. 15, 2016

(86) PCT No.: PCT/EP2016/000462
§ 371 (c)(1),
(2) Date: Sep. 7, 2017

(87) PCT Pub. No.: WO2016/146256
PCT Pub. Date: Sep. 22, 2016

(65) Prior Publication Data
US 2018/0105421 A1    Apr. 19, 2018

(30) Foreign Application Priority Data

Mar. 19, 2015   (AT) .............. GM 70/2015 U

(51) Int. Cl.
*C01B 32/05*    (2017.01)
*C23C 14/06*    (2006.01)
(Continued)

(52) U.S. Cl.
CPC ............. *C01B 32/05* (2017.08); *B22F 3/12* (2013.01); *B22F 7/008* (2013.01); *C01B 32/921* (2017.08);
(Continued)

(58) Field of Classification Search
None
See application file for complete search history.

(56) References Cited

U.S. PATENT DOCUMENTS 6,143,142 A * 11/2000 Shi .................. C23C 14/06
                                                                204/192.12
8,882,975 B2  11/2014 Yahagi et al.
(Continued)

FOREIGN PATENT DOCUMENTS

AT        11884 U1      6/2011
EP    2062994 A1      5/2009
(Continued)

OTHER PUBLICATIONS

Daniel B. Miracle, Introduction to Composites, 2001, ASM Handbook vol. 21: Composites (Year: 2001).*
(Continued)

*Primary Examiner* — Colleen P Dunn
*Assistant Examiner* — Michael J Kachmarik
(74) *Attorney, Agent, or Firm* — Laurence A. Greenberg; Werner H. Stemer; Ralph E. Locher

(57) ABSTRACT

A coating source for physical vapor deposition to produce doped carbon layers. The coating source is produced by way of sintering from pulverulent components and is formed of carbon as matrix material in a proportion of at least 75 mol % and at least one dopant in a proportion in the range from 1 mol % to 25 mol %.

6 Claims, 4 Drawing Sheets

(51) Int. Cl.
| | |
|---|---|
| *C01B 32/956* | (2017.01) |
| *C01B 32/921* | (2017.01) |
| *B22F 3/12* | (2006.01) |
| *B22F 7/00* | (2006.01) |
| *C23C 14/32* | (2006.01) |
| *C23C 14/34* | (2006.01) |
| *H01J 37/34* | (2006.01) |
| *H01J 37/32* | (2006.01) |
| *C23C 14/58* | (2006.01) |

(52) U.S. Cl.
CPC ........ *C01B 32/956* (2017.08); *C23C 14/0605* (2013.01); *C23C 14/325* (2013.01); *C23C 14/3414* (2013.01); *C23C 14/5806* (2013.01); *H01J 37/32614* (2013.01); *H01J 37/3426* (2013.01); *H01J 37/3491* (2013.01); *B22F 2302/10* (2013.01); *B22F 2302/40* (2013.01); *B22F 2998/10* (2013.01); *C01P 2004/61* (2013.01)

(56) References Cited

U.S. PATENT DOCUMENTS

| | | |
|---|---|---|
| 9,299,543 B2 | 3/2016 | Takahashi |
| 9,481,925 B2 | 11/2016 | O'Sullivan |
| 2011/0017590 A1 | 1/2011 | Fukuyo et al. |
| 2012/0279857 A1 | 11/2012 | Takahashi et al. |
| 2014/0346039 A1* | 11/2014 | Ogino .................. C22C 5/04 204/298.13 |

FOREIGN PATENT DOCUMENTS

| | | |
|---|---|---|
| EP | 2270252 A1 | 1/2011 |
| EP | 2436799 A1 | 4/2012 |
| JP | 2005060765 A | 3/2005 |

OTHER PUBLICATIONS

James Gary Pruett, Carbon Matrices, 2001, ASM Handbook vol. 21: Composites (Year: 2001).*
K.K. Chawla, Processing of Ceramic-Matrix Composites, 2001, ASM Handbook vol. 21: Composites (Year: 2001).*
JP 2005/060765 Machine translation (Year: 2005).*
Nikhilesh Chawla, Mechanical Behavior of Particle Reinforced Metal Matrix Composites, 2001 (Year: 2001).*
Chaus et al., "Surface, microstructure and optical properties of copper-doped diamond-like carbon coating deposited in pulsed cathodic arc plasma", Diamond & Related Materials 42 (2014) pp. 64-70.
VDI 2840 "Carbon films—Basic knowledge, film types and properties" VDI Richtlinien Jun. 2012.
Yu et al., "Etching behaviour of pure and metal containing amorphous carbon films prepared using filtered cathodic vaccum arc technique", Applied Surface Science 195 (2002) pp. 107-116.

* cited by examiner

COATING SOURCE FOR PRODUCING DOPED CARBON LAYERS

BACKGROUND OF THE INVENTION

Field of the Invention

The present invention relates to a coating source for the physical vapour deposition of doped carbon layers, in particular of doped amorphous carbon layers, and a production process for such a coating source.

Amorphous carbon layers (amorphous diamond-like carbon, DLC) are carbon-containing layers which, in contrast to graphite layers (which have a crystalline structure and $sp^2$-hybridized carbon atoms) and diamond layers (which have a crystalline structure and $sp^3$-hybridized carbon atoms), consist structurally of an amorphous network of $sp^2$- and $sp^3$-hybridized carbon atoms. Amorphous carbon layers can be hydrogen-free or contain hydrogen and be doped with other elements. The various layer types of amorphous carbon layers are classified in VDI 2840 (Verein Deutscher Ingenieure, Kohlenstoffschichten, Grundlagen, Schichttypen and Eigenschaften). Owing to both graphite-like and also diamond-like structures, many properties of amorphous carbon layers lie between those of graphite and diamond. Amorphous carbon layers are characterized by a diamond-like hardness (hardness up to 90 GPa) and at the same time have high wear resistance, a low coefficient of friction and good layer adhesion. These layers are therefore being increasingly used for, inter alia, tribological applications, for example as friction-reducing and wear-resistant coatings for automobile components. In addition, amorphous carbon layers have excellent biocompatibility.

Apart from these advantageous properties, a limited thermal stability is a disadvantage, since the poor oxidation resistance of amorphous carbon layers leads to a limited use temperature of about 350° C.

Amorphous carbon layers are generally deposited as thin layers having layer thicknesses of a few microns, usually by means of chemical or physical vapour deposition. An important chemical vapour deposition (CVD) process which may be mentioned is plasma-assisted chemical vapour deposition (PA-CVD, also referred to as plasma-enabled CVD) in which the chemical deposition is aided by a plasma, usually produced by means of an external high-frequency alternating voltage.

The physical vapour deposition (PVD) processes which are most widely used for producing amorphous carbon layers are magnetron cathode atomization (magnetron sputter deposition) and electric arc processes (arc-PVD, also referred to as arc evaporation). In magnetron cathode atomization, a working gas (e.g. argon or carbon-containing gases) which has been ionized by a plasma is accelerated onto a target formed by the coating material in a chamber, as a result of which particles of the coating material are knocked out, go over into the gas phase and are deposited from the gas phase on the substrate to be coated. An additional magnetic field is applied in the vicinity of the active surface of the target in order to increase the sputtering rate and thus accelerate the coating operation. In electric arc evaporation processes, the coating material provided as cathode is locally melted and vaporized by means of an electric arc which migrates across the cathode. The partially ionized coating material vapour spreads out, optionally assisted by an additionally applied electric potential, from the cathode and condenses on the substrate surface to be coated. The production of amorphous carbon layers by means of electric arc evaporation from graphite cathodes is very difficult because of the strong temperature dependence of the electrical conductivity of graphite. Due to the limited mobility of the electric arc, pinning effects in which the electric arc remains locally in one place frequently occur, as a result of which homogeneous ablation of the graphite cathodes is hindered. An advantage of PVD processes over CVD processes is that the thermal stressing of the substrate is generally lower in the case of PVD processes than in CVD processes and relatively heat-sensitive materials can therefore also be coated by means of PVD processes. When a reactive gas is used, chemical reactions with the working gas can also occur in PVD processes.

The properties of amorphous carbon layers are manifold and can be set in wide ranges by variation of the hydrogen content and suitable doping. In general, both metals (carbide-forming metals such as tungsten, titanium or vanadium and non-carbide-forming metals such as gold, copper or silver) and also non-metallic elements (for example silicon, oxygen, nitrogen, fluorine and boron) are employed as doping material (dopant). Thus, for example, the thermal stability, the wear resistance and the coefficient of friction of the carbon layers can be influenced by doping with silicon, titanium, chromium, tungsten or molybdenum, with the proportion of the dopant usually being less than 25 mol % (mol percent).

The production of high-quality doped amorphous carbon layers is at present associated with numerous challenges. Firstly, the complexity of the coating process is significantly increased. In CVD processes, doping is effected by additional vaporization of a chemical compound of the desired dopant (in the case of a titanium-doped amorphous carbon layer, for example by vaporization of $TiCl_4$), in the case of PVD processes by parallel atomization (cosputtering) of graphite and an elemental target or cathode (for example an additional titanium coating source). A particular disadvantage when using a plurality of coating sources is the poor homogeneity of the applied layers; in addition, relatively low growth rates are generally achieved. In the production of doped carbon layers, CVD processes have the disadvantage compared to PVD processes that many important dopants such as molybdenum or tungsten are not present in a suitable liquid or gaseous compound. This is one of the disadvantages compared to PVD processes.

To improve the layer homogeneity, there are first approaches in which the required coating materials are joined together in one target or a cathode composed of a composite material (Chaus et al., Surface, microstructure and optical properties of copper-doped diamond-like carbon coating deposited in pulsed cathodic arc plasma, Diamond & Related Materials 42 (2014), p 64-70). In Chaus et al., a cylindrical cathode target composed of graphite (diameter 32 mm) in which rods made of the dopant copper (diameter 6 mm) are embedded (known as plug cathode) is used. However, the quality of the layers produced is not fully satisfactory for industrial applications, since inhomogeneities attributable to variation over time of the composition of the vaporized coating material nevertheless occur in the coating layer. In addition, the ablation of the cathode is inhomogeneous due to the different vaporization rates of the graphite region and the copper rods and the life of the cathode is reduced thereby.

Targets in which a porous main element composed of graphite is infiltrated with a melt of a dopant or via a gas phase comprising the dopant are also known. In the interests of infiltrability, the graphite main element has to have an open-pored structure and for this reason the proportion of the dopant cannot be chosen below a particular threshold value in the case of infiltrated graphite targets. If infiltration is stopped prematurely in order to set low contents of dopants, a high proportion of porosity remains. An additional disadvantage is that inhomogeneities in the ablation of the material occur in the coating process because of the continuous network of the dopant in the target.

An example of a coating source in which graphite and dopant are combined in one unit is indicated in JP2005/060765. More precise information about the make-up of the coating source and about the production process, for example whether the target is in the form of a plug cathode or in the form of an infiltrated target, is absent.

BRIEF SUMMARY OF THE INVENTION

It is an object of the present invention to provide a coating source for physical vapour deposition for the production of doped carbon layers, in particular of doped amorphous carbon layers, in the case of which the abovementioned disadvantages occurring when using a plurality of coating sources are avoided or reduced. The coating source should, in particular allow a very homogeneous distribution of the dopant in the deposited carbon layer. In addition, there should not be a tendency for a locally increased vaporization rate to occur in electric arc evaporation. A further object of the present invention is to provide a production process for such a coating source.

This object is achieved by a process for producing a coating source for the vapor deposition of doped carbon layers as claimed and by a doped coating source as claimed. Advantageous embodiments of the invention are subject matter of dependent claims.

The doped coating source of the invention is produced by sintering of a powder mixture composed of carbon-containing powder (or a carbon-containing powder mixture) and dopant-containing powder (or a dopant-containing powder mixture). It comprises carbon as a matrix material in a molar proportion of at least 75 mol % and at least one dopant in a molar proportion in the range from 1 mol % to 25 mol %, preferably from 1 mol % to 20 mol %, particularly preferably from 2 mol % to 10 mol %. The molar proportion of the at least one dopant can advantageously be less than 5 mol % here. Apart from the dopant, usual production-related impurities such as sulfur can be present in the coating source, with the amount of impurities typically being less than 1000 ppm. The dopant serves to effect targeted modification of the carbon layer deposited using the coating source.

The dopant can be a metal or a semimetal. The dopant can also be an oxidic, nitridic, boridic or silicidic compound of a metal or of a semimetal. In particular, the metals titanium, vanadium, chromium, zirconium, niobium, molybdenum, hafnium, tantalum, tungsten and the semimetal silicon can be used as dopant. In addition, oxides, nitrides, borides or silicides of the metals titanium, vanadium, chromium, zirconium, niobium, molybdenum, hafnium, tantalum, tungsten or oxides, nitrides, borides of the semimetal silicon can be used as dopant.

The dopant can be present in the coating source in substantially unchanged form or can have reacted chemically with the matrix material carbon during the sintering process. The dopant can also have been introduced in the form of a carbidic compound of the dopant into the matrix material, for example as metal carbide or semimetal carbide.

With regard to the dopant, reference is made in the present patent application to one or more elements or chemical compounds which, disregarding any impurities, are present in the coating source in addition to the carbon. If the coating source is produced using a powder of a carbidic compound of a doping material or chemical reactions between the doping material and the carbon occur during the sintering operation, the term dopant will for the purposes of the present invention refer to the doping material and not to the carbidic compound of the doping material. If, for example, the coating source is produced from a starting powder composed of a metal carbide or a semimetal carbide, the dopant of the coating source will for the purposes of the present invention be considered to be the corresponding metal or semimetal and not the metal carbide or semimetal carbide. An analogous situation applies when a metal or semimetal powder which reacts with the carbon during the production process is used. Here too, the dopant will for the purposes of the present invention be considered to be the corresponding metal or semimetal and not the carbidic compound of the metal or semimetal. The two coating sources lead to a carbon layer doped with the corresponding metal or semimetal in the coating process.

The doping in the coating source can but does not necessarily have to be the same as the doping in the carbon layer deposited by means of the coating source. Owing to various processes occurring in the coating process, for example chemical reactions with the process gas, the chemical composition of the deposited doped carbon layer or the ratio between doping material and carbon in the deposited carbon layer can differ from the doping in the coating source.

The term coating source refers, in particular, to a target in magnetron cathode atomization or to a cathode in electric arc evaporation.

The key concept of the invention is thus that the dopant is embedded in finely divided particle form in a carbon matrix. This is achieved by the production of the coating source from pulverulent components by means of sintering. Carbon (graphite) and dopant are therefore not present as in the prior art in separate coating sources or in macroscopically separate regions in a coating source, as, for example, in the case of plug cathodes or in the case of coating sources produced by infiltration. The doped coating source of the invention simplifies production and significantly increases the quality of the doped carbon layers deposited therewith. While in the case of conventional coating sources (separate graphite and dopant target or cathode) the operating parameters of each individual coating source have to be monitored separately in order to achieve approximately homogeneously doped layers, in the case of the present invention carbon and dopant are vaporized or atomized from the same coating source. For this reason, only the operating parameters for a single coating source have to be regulated. The ratio of the vaporization rate between matrix material and dopant is largely time-independent. Additionally, the composition of the vaporized material is also largely position-independent and barely varies from place to place over the substrate surface to be coated. It is therefore possible to avoid the problems occurring in the prior art, especially in the coating of large-area substrates, in which the coating sources composed of graphite and dopant are positioned in different places and the elements originating from the individual coating sources do not deposit uniformly on the substrate area to be coated.

A further advantage is that the ablation of the coating source configured as cathode proceeds more uniformly in the case of electric arc evaporation. The dopant-containing particles act as interfering elements in the microstructure of the cathode and positively influence the running properties of the electric arc over the surface of the cathode. The electric arc is thereby interrupted every now and again and ignited afresh at another point. The better running properties of the electric arc also improve the quality of the deposited layers. In the case of the cathode according to the invention, pinning effects occur more rarely and as a result less strongly pronounced local points of insipient melting occur than in the case of a pure graphite cathode, and deposits in the form of spatters (droplets) therefore occur to a reduced extent.

The microstructure of the coating source can comprise at least two different crystallographic phases, with at least one phase comprising the dopant. The dopant-containing particles can thus form a separate crystallographic phase in the phase of the matrix material carbon. The dopant can react chemically with the carbon or can be present in a form which has not reacted with the carbon. For the purposes of the present invention, a dopant-containing particle can be either a particle in which the dopant is present in a form which has reacted with the carbon or a particle in which the dopant is present in a form which has not reacted with the carbon.

In a preferred embodiment, the average particle size of the dopant-containing particles is less than 50 µm, in particular less than 20 µm.

The dopant-containing particles are macroscopically (on a length scale in the mm range) uniformly distributed in the microstructure of the coating source. The average spacing of the dopant-containing particles is preferably less than 50 µm, in particular less than 20 µm. The small size and fine dispersion of the dopant in the carbon matrix brings about an extremely homogeneous composition which is constant over time of the vaporized or atomized coating material; it is therefore possible to deposit carbon layers having a very uniformly distributed dopant.

The distribution of the dopant-containing particles, the average particle size and the average spacing is, as is known in the technical field, determined with the aid of a cross section of the sample. The surface obtained is here embedded in a resin, ground, polished and examined using a scanning electron microscope (or as an alternative using an optical microscope) and evaluated quantitatively. For the purposes of the present invention, uniform distribution of the dopant-containing particles means that, when a cross section of the sample is examined under a scanning electronic microscope and the number of dopant-containing particles in various, representative sections of the image is counted, the scatter of the frequency distribution of the number of dopant-containing particles per section of the image is small. If, for example, a square having a side length of about 25 times the average particle size of the dopant-containing particles is selected for the size of the section of the image and the number of dopant-containing particles which are located completely within the image section is determined in a series of ten different image sections, in each case per image section, the number of dopant-containing particles in the individual image sections does not deviate by more than a factor of 3 from the average number (determined from the ten image sections) of dopant-containing particles per image section.

The coating source of the invention is used in the form of a target or as cathode for the physical vapour deposition of doped carbon layers, in particular of doped amorphous carbon layers. Carbon-containing processes gases such as acetylene or methane are preferably used in the coating process.

The invention also provides a production process for the above-described coating source. To produce such a coating source, a powder mixture of carbon-containing powder and powder comprising the desired dopant is used as starting material. As carbon-containing powder, it is possible to use powder ora powder mixture composed of natural or synthetic graphite, coke, amorphous carbon or carbon black. Graphite, coke and carbon black have a graphitic crystal structure; there are differences in the freedom from defects and size of the individual crystallites. The term dopant-containing powder also encompasses a powder mixture which comprises the dopant and also, in particular, a powder or a powder mixture composed of a carbidic compound of the dopant. To produce a coating source for the deposition of a carbon layer doped with a metal or semimetal, it is possible to use a powder of the corresponding metal or semimetal. However, a powder of a carbide of the corresponding metal or semimetal can also be used. A coating source produced from such a carbide powder also leads to a carbon layer doped with the corresponding metal or semimetal in the coating process. Should a coating source for deposition of carbon layers having a plurality of dopants be required, the powder mixture can comprise components of a plurality of dopants.

The starting powders can be milled dry or wet and are intensively mixed in a mixing chamber. The milling operation can be carried out with introduction of milling media, by which means agglomerates and lumps of particles are comminuted, homogeneous distribution of the mixing components is achieved and the mixing operation is accelerated. The powder mixture obtained preferably has an average particle size having a diameter of less than 50 µm. The carbon-containing powder and/or the dopant-containing powder preferably has an average particle size having a diameter of less than 50 µm, as a result of which extremely homogeneous distribution of the dopant in the coating source can be achieved. A suitable mixing ratio between dopant and carbon-containing powder is set so that, after the sintering process, a shaped body having a proportion of carbon of at least 75 mol % and at least one dopant in a proportion in the range from 1 mol % to 25 mol %, in particular from 1 mol % to 20 mol %, is obtained.

After the milling process, the powder mixture is introduced into a moulding tool, for example into a graphite mould, and sintered at temperatures of from 1300° C. to 3000° C. in a suitable atmosphere. The sintering process is, in particular, carried out in an inert or reducing atmosphere or under reduced pressure. The sintering process is preferably assisted by pressure, i.e. sintering is effected with compaction of the powder mixture under an applied mechanical pressure of at least 1 MPa, preferably from 5 to 50 MPa. The mechanical pressure is advantageously applied stepwise during heating and maintained for a certain time. Advantageous and in particular inexpensive sintering processes for the coating source are rapid hot pressing processes, for example by means of hot pressing heated by heating conductors or inductively heated hot pressing, or sintering processes by means of direct passage of current (for example spark plasma sintering). While in the case of sintering with direct passage of current the heat is generated internally by flow of current through the powder, in the case of hot pressing the heat is introduced from the outside. These processes are characterized by high heating and cooling rates and short process times. Shaped bodies having, in particular, a high density of at least 80%, preferably at least 90% of the theoretical density, can be obtained thereby. If the powder mixture is pressed uniaxially during the sintering operation, a shaped body in which the microstructure has an oriented structure aligned in a direction perpendicular to the pressing direction is obtained, i.e. the microstructure has a preferential orientation. The sintered shaped body can optionally be heat-treated after sintering at temperatures in the range from 2000° C. to 3000° C. without additionally applied external pressure in order to effect graphitization. As a result of this high-temperature treatment, the size and proportion of the graphite crystallites increases; in addition, the thermal and electrical conductivity of the shaped bodies improve. At the same time, the shaped body becomes purer since possible impurities (apart from the desired dopants) vapourize.

Finally, the sintered shaped body is worked mechanically, for example by means of cutting tools, to give the desired final shape of the coating source.

The production of the doped graphite coating source of the invention has an important advantage compared to the production of a pure graphite coating source. Pure carbon (graphite) is difficult to sinter since an additional binder matrix is required to achieve cohesion of the carbon powder. Pitches or polymers having a high carbon content are usually employed for this purpose, and these are converted into carbon in a thermal treatment step. In the production of a doped carbon coating source, the addition of the dopant assists the sintering process, in part by reaction of the dopants with the carbon. In addition, a better densification of the shaped body is attained.

DESCRIPTION OF THE INVENTION

The invention is illustrated below with the aid of three working examples and associated figures. Working example 1 relates to variants of coating sources doped with the semimetal silicon, working example 2 relates to a coating source doped with the metal titanium and working example 3 relates to a coating source doped with the chemical compound chromium diboride.

Working Example 1

As working example 1, a round target having a diameter of 75 mm and a thickness of 5 mm was produced from a powder mixture of graphite (C) and silicon (Si). As starting material, use was made of about 1.5 kg of a mixture of Si powder and C powder (average particle size d50 of about 10 µm) in a mixing ratio of 10/90 mol %, which were milled wet with addition of 5 l of isopropanol and 5 kg of milling media composed of Si nitride for 4 hours on a pot roller. After the milling media had been separated off, the powder mixture was dried by evaporation of the alcohol at about 100° C. and subsequently fractionated in a sieving unit having a mesh opening of 1 mm. Chemical analysis of the resulting Si/C powder batch indicated a proportion of Si of 10 mol % and a carbon content of 90 mol %. The powder mixture was subsequently densified in a spark plasma sintering plant (SPS plant) using graphite pressing tools at a pressing pressure of 30 MPa and sintered at a temperature of 2100° C. with direct passage of current to give a round having a diameter of 85 mm and a thickness of 8 mm. At a sintering temperature of 2100° C., a density of 1.90 g/cm$^3$ was achieved, corresponding to 88% of the theoretical density of the material. The sintered round was subjected to final cutting machining to give a target having a diameter of 75 mm and a thickness of 5 mm.

Additional variants (mixing ratio of C to Si powder: 90/10 mol %) were produced at sintering temperatures of 1500° C. and 1800° C.; here, a density of 1.77 g/cm$^3$ (83% of the theoretical density (at 1500° C.) or a density of 1.78 g/cm$^3$ (83% of the theoretical density) (at 1800° C.) was achieved.

To analyse the sintered round, specimens were cut from the round and analysed in a polished section by means of scanning electron microscopy and X-ray phase analysis.

Figure 1:
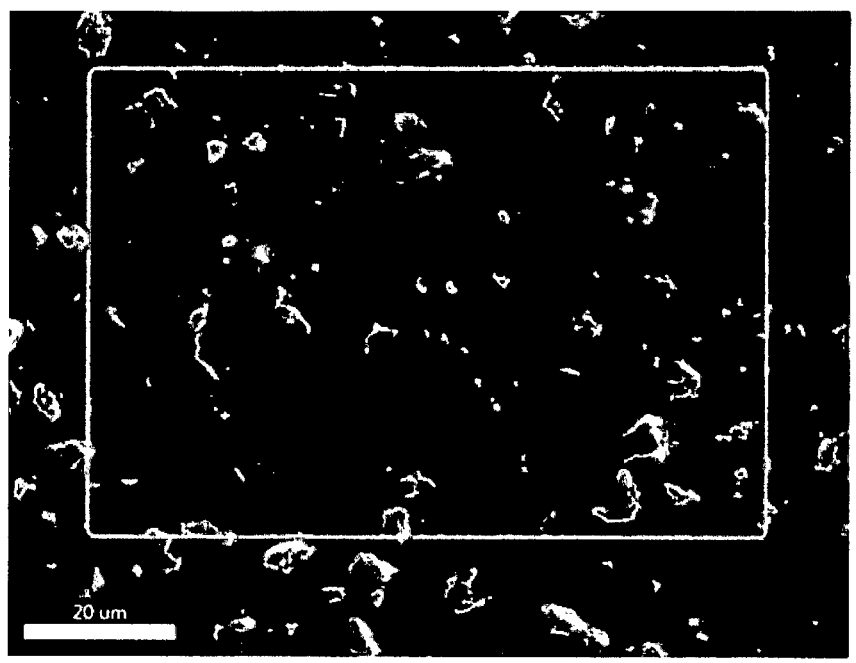
FIG. 1 is a scanning electron micrograph of a microstructure according to a working example.

FIG. 1 depicts a scanning electronic micrograph of the microstructure of a polished section through the specimen of the round sintered at 2100° C. (the size of the image section is about 115 µm×90 µm, the scale bar corresponds to 20 µm). A fine-grain, homogeneous structure of the microstructure can be seen in the micrograph. In addition, the high density of the microstructure with a very low porosity can be seen. In this figure, the oriented structure of the microstructure cannot be seen since the plane of the polished section is perpendicular to the pressing direction and thus also to the orientation of the microstructure.

Figure 2:
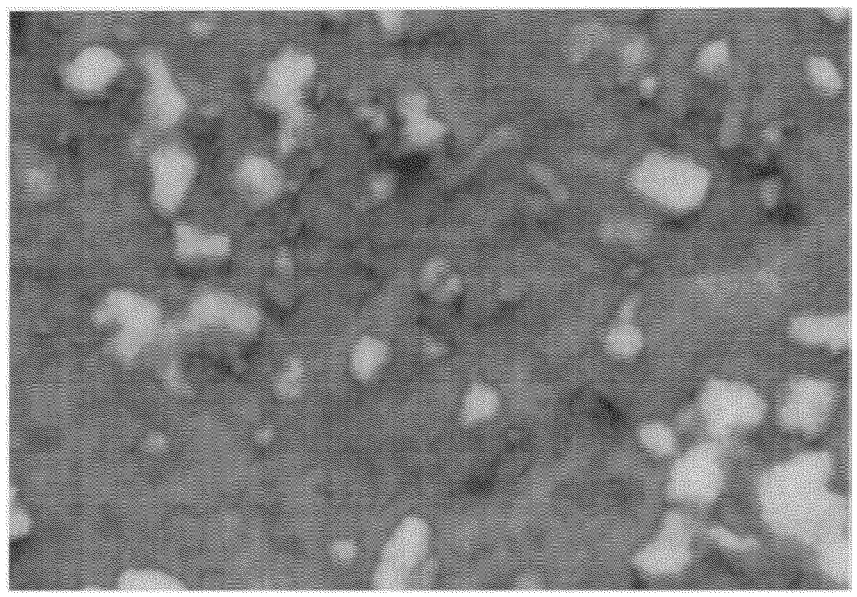
FIG. 2 is an energy-dispersive X-ray spectrograph of the rectangular outline in FIG. 1.
Figure 3:
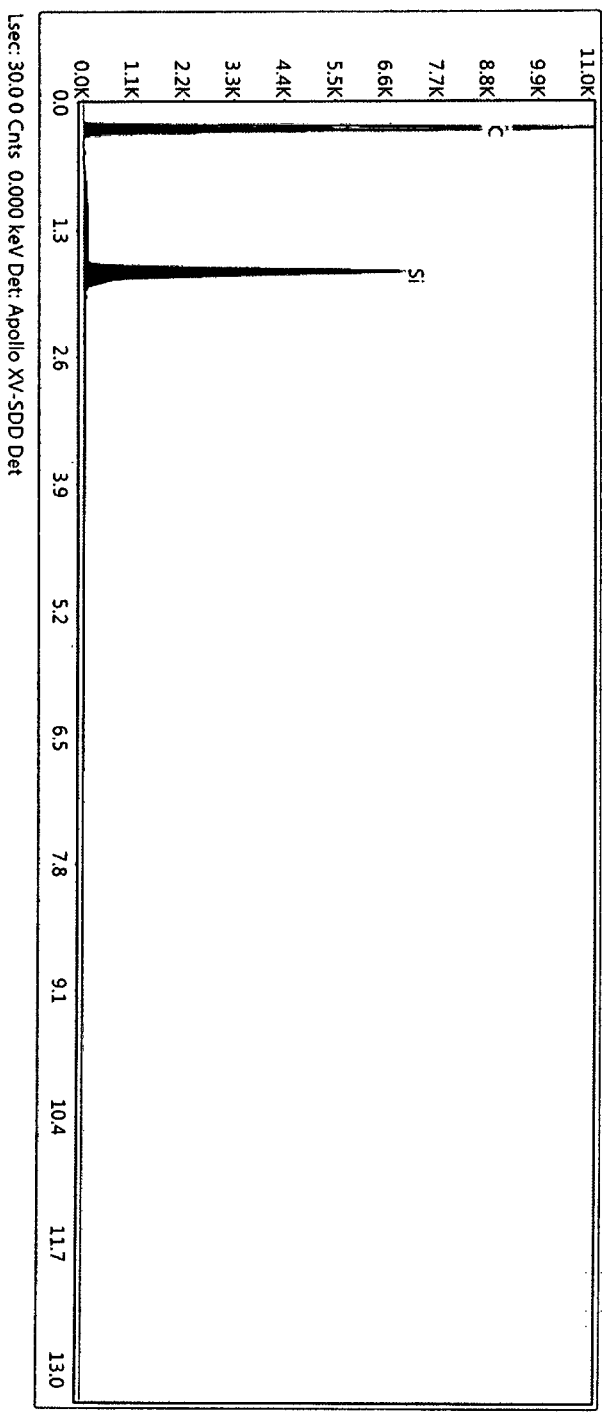
FIG. 3 is an EDX analysis diagram plotting counting pulses over the energy.

FIG. 2 shows the element distribution determined by means of energy-dispersive X-ray spectroscopy (EDX) on the region of the sample outlined in FIG. 1, with Si being shown light and C being shown dark. It can be seen from the EDX analysis (the number of counting pulses is shown as a function of the energy in keV in FIG. 3) the round consists essentially of only the elements Si and C. The measurement of the particle size of the Si-containing particles indicated an average diameter of less than 10 µm, and the average spacing of these particles is less than 20 µm. The Si-containing particles are uniformly distributed in the microstructure of the coating source.

An X-ray diffraction pattern (XRD) of the sample shows that the dopant silicon is present only in the form of Si carbide, i.e. in a form which has reacted with the carbon, which indicates a chemical reaction between silicon and carbon which has occurred during the sintering process. Thus, two different crystallographic phases, namely a C phase and an Si carbide phase, are present in the microstructure.

Figure 4:
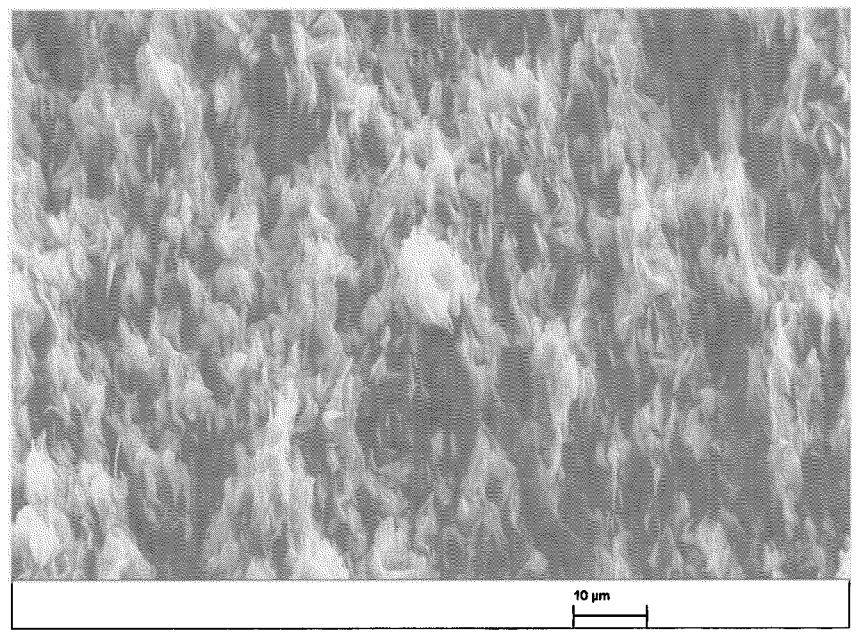
FIG. 4 is a scanning electron micrograph of a polished section of a target according to the invention.

FIG. 4 shows a scanning electron micrograph of the microstructure of a polished section of a variant of a silicon-doped target having a proportion of Si of 5 mol % and a carbon content of 95 mol %. The target was produced in a manner analogous to the above variants with an appropriate mixing ratio of C/Si powders in an SPS plant at a sintering temperature of 1500° C. (the scale bar corresponding to 10 µm). An oriented structure which is attributable to the pressing process during the sintering operation is clearly discernible in the microstructure.

These variants of silicon-doped targets serve to deposit silicon-doped carbon layers, in particular silicon-doped amorphous carbon layers. The deposition of the desired layers was demonstrated with the aid of the target variant described first. The round which was composed of the material CSi 90/10 mol % (diameter 75 mm, thickness 5 mm) and had been sintered at 2100° C. was soldered over its area by means of indium to a backing plate composed of copper having a diameter of 75 mm and a thickness of 3 mm. The target obtained in this way was used in a PVD plant to coat a substrate composed of cemented hard material by the DC sputtering process. The target displayed stable behaviour in respect of the ignition and stability of the plasma as powers of 200 watt (500 V and 0.4 A), 300 watt (550 V and 0.55 A) and 400 watt (570 V and 0.7 A). Silicon and carbon were detected in the layers deposited on the substrate composed of cemented hard material.

Working Example 2

In working example 2, a titanium-doped coating source for deposition of titanium-doped carbon layers was produced. As starting material for the round target having a diameter of 75 mm and a thickness of 5 mm, use was made of about 1.5 kg of a mixture of Ti powder and C powder (average particle size d50 of about 10 μm) in a mixing ratio of 10/90 mol % which was milled wet with addition of 5 l of isopropanol and 5 kg of milling media composed of Si nitride for four hours in a pot roller. The individual manufacturing steps are analogous to the process steps in working example 1, and the dried powder mixture was sintered at a pressing pressure of 30 MPa and a temperature of 2100° C. with direct passage of current and subsequently worked mechanically. The XRD examination carried out on polished sections of the sintered specimen showed that the titanium is present only in the form of Ti carbide in the microstructure as a result of reaction with the carbon.

Working Example 3

In working example 3, a target was produced for the physical vapour deposition of carbon layers doped with chromium diboride. The production steps are analogous to those in the process steps in the previous working examples.

As starting material for the round target having a diameter of 75 mm and a thickness of 5 mm, use was made of about 1.5 kg of a mixture of chromium diboride powder and C powder (average particle size d50 of about 10 μm) in a mixing ratio of 10/90 mol % which was milled wet with addition of 5 l of isopropanol and 5 kg of milling media composed of Si nitride for 4 hours on a pot roller. The dried powder mixture was sintered at a pressing pressure of 30 MPa and a temperature of 2100° C. to give a round having a diameter of 85 mm and a thickness of 8 mm and subsequently after-worked mechanically. An XRD examination carried out on polished sections of the sintered specimen showed that the dopant is present in a form which has not reacted with the carbon.

The invention claimed is:

1. A coating source for physical vapor deposition to produce doped carbon layers, the coating source comprising:
    a sintered shaped body produced by sintering from pulverulent components including carbon as matrix material in a proportion of at least 75 mol % and at least one dopant in a proportion in the range from 1 mol % to 25 mol %, said at least one dopant embedded in divided particles in said matrix material of carbon, said particles defining dopant-containing particles;
    said sintered shaped body including a microstructure having said dopant-containing particles uniformly distributed therein;
    said microstructure having an oriented structure; and
    said microstructure including at least two different crystallographic phases with at least one phase including said at least one dopant.

2. The coating source according to claim 1, wherein the dopant is a material selected from the group consisting of a metal, a semimetal, a metal oxide, a semimetal oxide, a metal nitride, a semimetal nitride, a metal boride, a semimetal boride, a metal silicide and a semimetal silicide.

3. The coating source according to claim 1, wherein the dopant is an element selected from the group consisting of titanium, vanadium, chromium, zirconium, niobium, molybdenum, hafnium, tantalum, tungsten and silicon or an oxidic, nitridic, boridic or silicidic compound of an element selected from the group consisting of titanium, vanadium, chromium, zirconium, niobium, molybdenum, hafnium, tantalum and tungsten or an oxidic, nitridic or boridic compound of silicon.

4. The coating source according to claim 1, wherein an average spacing of the dopant-containing particles is less than 50 μm.

5. The coating source according to claim 1, wherein a density of the coating source is greater than 80% of a theoretical density.

6. A method of depositing carbon layers, the method comprising using the coating source according to claim 1 for depositing doped carbon layers.

* * * * *